United States Patent
Baccini

Patent Number: 6,017,410
Date of Patent: Jan. 25, 2000

[54] METHOD TO ANCHOR FOILS FOR GREEN-TAPE CIRCUITS

[76] Inventor: Gisulfo Baccini, Via Duca d'Aosta 1, Mignagola di Carbonera (TV), Italy, 31030

[21] Appl. No.: 07/931,330

[22] Filed: Aug. 18, 1992

[30] Foreign Application Priority Data

Sep. 30, 1991 [IT] Italy .................................. UD91A0156

[51] Int. Cl.⁷ .......................... B32B 31/00; B32B 31/24; C03B 29/00; B23K 26/00
[52] U.S. Cl. ........................ 156/290; 156/89; 156/272.8; 156/379.6; 156/378; 219/121.6
[58] Field of Search .......................... 156/89, 290, 272.8, 156/73.5, 272.4, 274.2, 272.2, 273.7, 379.6, 380.3, 273.9, 64, 378, 350, 359; 219/6.5, 10.41, 10.53

[56] References Cited

U.S. PATENT DOCUMENTS

| | | | |
|---|---|---|---|
| 3,138,514 | 6/1964 | Florio | 156/291 |
| 3,203,823 | 8/1965 | Grimes | 156/291 |
| 3,405,045 | 10/1968 | Hoskins | 156/272.8 |
| 3,444,925 | 5/1969 | Johnsone | 165/166 |
| 3,560,291 | 2/1971 | Foglia | 156/229 |
| 3,616,200 | 10/1971 | Reibach | 161/225 R |
| 3,682,740 | 8/1972 | Newton | 156/291 |
| 3,770,529 | 11/1973 | Anderson | 156/272.8 |
| 4,025,462 | 5/1977 | Cleveland | 252/477 R |
| 4,069,080 | 1/1978 | Osborne | 156/272.8 |
| 4,499,149 | 2/1985 | Bergen | 428/447 |
| 4,752,352 | 6/1988 | Feygin | 156/272.8 |
| 4,776,904 | 10/1988 | Charlton | 156/272.8 |
| 4,814,030 | 3/1989 | Dubuisson et al. | 156/89 |
| 4,816,036 | 3/1989 | Kotchick | 429/32 |
| 4,818,312 | 4/1989 | Benge | 156/272.8 |
| 4,957,577 | 9/1990 | Huebner | 156/197 |
| 5,089,455 | 2/1992 | Ketcham et al. | 501/104 |
| 5,174,842 | 12/1992 | Hamuro | 156/290 |
| 5,190,834 | 3/1993 | Kendall | 429/31 |
| 5,217,656 | 6/1993 | Buckley et al. | 264/22 |
| 5,219,673 | 6/1993 | Kaun | 429/32 |

FOREIGN PATENT DOCUMENTS

| | | |
|---|---|---|
| 0 235 582 | 9/1987 | European Pat. Off. . |
| 2100259 | 3/1972 | France . |
| 8070886 | 4/1983 | Japan ............. 156/309.6 |
| 60-111778 | 6/1985 | Japan . |
| 62-171423 | 7/1987 | Japan . |
| 63-30554 | 12/1988 | Japan . |
| 1136709 | 5/1989 | Japan ............. 156/308.2 |
| 1220890 | 9/1989 | Japan . |
| 2241091 | 9/1990 | Japan . |
| 2254789 | 10/1990 | Japan . |
| 3193335 | 8/1991 | Japan . |
| 4172181 | 6/1992 | Japan . |
| 4172182 | 6/1992 | Japan . |

OTHER PUBLICATIONS

McGraw–Hill Dictionary of Scientific and Technical Terms, second edition, Daniel N. Lapedes, Editor in Chief, published by McGraw–Hill Book Company, New York, p. 1046, 1978.

(List continued on next page.)

*Primary Examiner*—Stanley S. Silverman
*Assistant Examiner*—Jacqueline A. Ruller
*Attorney, Agent, or Firm*—Nixon & Vanderhye P.C.

[57] ABSTRACT

Method to anchor foils for green-tape circuits, whereby the foils of alumina in the raw state or of another like or analogous material, which are personalized, printed and dried, are superimposed on each other in a coordinated and organized manner, at least one green-tape foil (10) being bonded to at least one other previously positioned green-tape foil (10) by means of at least one weld (11-12-13-14-15) made by a source of heat (laser, microwaves, ultrasounds, hot point, etc.).

6 Claims, 1 Drawing Sheet

OTHER PUBLICATIONS

Patent Abstract of Japan, vol. 13, No. 240 (E–767) Jun. 6, 1989 & JP–A–01 042 198 (Sumitomo Bakelite Co Ltd) Feb. 14, 1989.

Patent Abstract of Japan, vol. 14, No. 557 (E–1011) Dec. 11, 1990 & JP–A–02 241 091 (Matsushita Electric Works Ltd) Sep. 25, 1990.

Patent Abstracts of Japan, vol. 15, No. 365 (E–1111) Sep. 13, 1991 & JP–A–03 142 910 (Murata Mfg Co Ltd) Jun. 18, 1991.

Patent Abstract of Japan, vol. 13, No. 144 (E–740) Apr. 10, 1989 & JP–A–63 305 594 (Sumitomo Bakelite Co Ltd) Dec. 13, 1988.

IBM Technical Disclosure Bulletin, vol. 22, No. 9, Feb. 1980 New York US p. 3988, Funari et al., "Multilayer . . . Film".

IBM Technical Disclosure Bulletin, vol. 27, No. 4B, Sep. 1984 New York, US, pp. 2368–2370, Gredinberg, "Location Slots . . . Method".

European Search Report.

METHOD TO ANCHOR FOILS FOR GREEN-TAPE CIRCUITS

BACKGROUND OF THE INVENTION

1. Field of the Invention

This invention concerns a method to anchor one foil to another foil in the production of multi-layer packs of circuits according to the so-called green-tape technology, as set forth in the main claim.

To be more exact, the anchorage method of this invention is carried out during the assembly of the green-tape foils before the compression step.

2. Discussion of Prior Art

The hybrid circuits of the so-called green-tape technology consist of thin foils of alumina in the raw state or of another like or analogous material, which have a printed circuit on one or both of their surfaces.

These green-tape foils are superimposed on one another in a number which may even amount to various tens of foils, and are compressed so as to produce a multi-layer element of a slender thickness.

The various components of the circuit in the single green-tape foils may be set in communication with each other through suitable connecting holes made in the green-tape foils and filled with a paste of a conductive material.

The anchorage operation of the state of the art is performed by applying an adhesive to the edges of each foil forming the green-tape circuit, so that the green-tape foils remain positioned and anchored together before the compression step is effected.

In this way any sliding of one foil in relation to another foil in the multi-layer pack of the green-tape circuit is prevented.

The above operation of anchorage by means of adhesives is performed by hand and involves considerable times and costs as well as a great number of rejects due to the inaccuracy of the application of the adhesives and to damage caused by manual handling.

SUMMARY OF THE INVENTION

The present applicant has studied, tested and brought about this invention so as to obtain a safe, effective anchorage method together with further advantages.

This invention is set forth and characterized in the main claim, while the dependent claims describe variants of the idea of the main solution.

This invention consists in providing a method which enables the single green-tape foils to be anchored to each other to form hybrid circuits according to the so-called green-tape technology.

To be more exact, the method of this invention enables each superimposed green-tape foil to be bonded to the previously positioned green-tape foil by at least one weld.

According to a variant the welding operation is carried out at one and the same time on a pack consisting of a plurality of green-tape foils superimposed on each other, which are all thus anchored to each other at the same time in one single operation.

The packs may consist even of various tens of green-tape foils, which are suitably kept firmly in position upon each other until the welding step has been carried out.

In this way any sliding of green-tape foils in relation to the adjacent green-tape foils during handling and compression is prevented.

The anchorage method of this invention is very accurate, reduces rejects to a minimum and makes possible very short cycle times and an excellent finished result.

The welding consists of at least two spot welds or at least two slot welds or at least two line welds.

We shall refer in the following description to spot welds but the contents of the description apply also to line welds and slot welds.

At least two spot welds can be made at two diametrically opposite corners of the green-tape foil, or at two corners of one and the same side of the green-tape foil, or at two end points of the central axis or else at any other points which fulfil the pre-set task.

Where there are three spot welds on each green-tape foil, two of these spot welds can be positioned, for instance, at two corners of one side, while the third spot weld is made at a central position on the opposite side.

The spot welds to anchor successive green-tape foils are made advantageously at other positions or at positions which do not coincide with the welding positions previously used, the purpose being to prevent warping of the multi-layer pack forming the green-tape circuit.

If a point on a green-tape foil is suitably heated, it is possible to melt the solvents contained in the alumina which constitutes the green-tape foil.

Thus, by heating the zones of a green-tape foil to be bonded and by superimposing another green-tape foil, the two green-tape foils adhere to each other by the melting action.

The heating can be carried out by precision-casting heating means or with a hot-melting electrode or by a laser or with high frequency systems or with ultrasonic or microwave welding systems or other means suitable for the purpose.

After the single green-tape foils have been assembled in a pre-set number and anchored together two by two, or all together simultaneously, with the method of this invention, the green-tape foils are compressed so as to provide a multi-layer electrical circuit of a slender thickness.

BRIEF DESCRIPTION OF THE FIGURES

The attached figures are given as a non-restrictive example and are diagrams of some forms of an anchorage method according to the invention for the production of a green-tape circuit consisting of a pack which comprises a plurality of green-tape foils as follows.

DETAILED DISCUSSION OF PREFERRED EMBODIMENTS

At least two zones of a first green-tape foil 10a are suitable heated by suitable heating means, which are not shown here, so as to obtain two welds, which in this example are spot welds 11.

These spot welds 11 are obtained by melting the solvents contained in the alumina which constitutes the green-tape foil 10a.

As we said above, the heat which causes the melting can be generated by precision casting heating means, or with a hot casting electrode, or by laser, or by high frequency systems, or with an ultrasonic or microwave welding system, or with other means suitable for the purpose, none of which is shown here.

Figure 1:
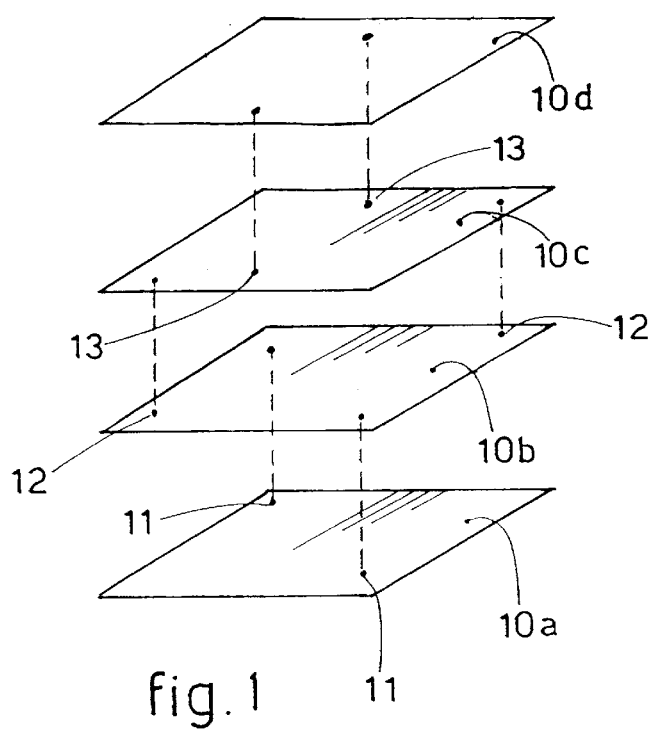
FIG. 1 shows a diagram of the method to anchor green-tape foils by spot welds according to the invention.

In the example of the green-tape foil 10*a* shown in FIG. 1 the two spot welds 11 are positioned near two opposite corners of the green-tape foil 10*a*.

At the same time a second green-tape foil 10*b* is placed on the first green-tape foil 10*a* already positioned. A reciprocal anchorage of the first and second green-tape foils 10*a*–10*b* is thus achieved.

Two spot welds 12 at corners different from the corners of the first spot welds 11 are now made in the same way on the second green-tape foil 10*b*.

A third green-tape foil 10*c* is then placed on the second green-tape foil 10*b* so as to accomplish reciprocal anchorage of the three green-tape foils 10*a*-10*b*-10*c*.

Thereafter two spot welds 13 are made on the third green-tape foil 10*c* at positions not coinciding with the positions of the previous spot welds 11–12.

A fourth green-tape foil 10*d* is now superimposed and is thus anchored to the third green-tape foil 10*c*.

When the pack consisting of the green-tape foils 10*a*-10*b*-10*c*-10*d* has been assembled and these green-tape foils have been anchored together with the method of the invention, the green-tape foils 10*a*-10*b*-10*c*-10*d* are compressed so as to produce a multi-layer electrical circuit of the so-called green-tape type.

According to a variant the green-tape foils 10 are superimposed on each other to form a multi-layer pack and are all welded together thereafter at the same time in one single welding operation according to the invention.

Figure 2A:
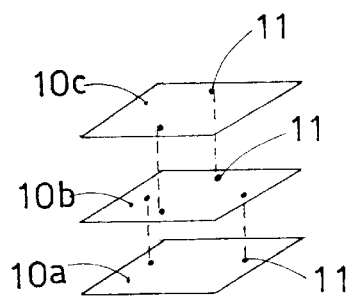
FIGS. 2a–2d are diagrams of some variants of the method of FIG. 1.
Figure 2B:
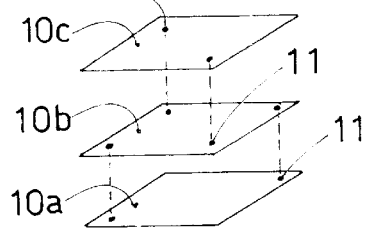
Figure 2C:
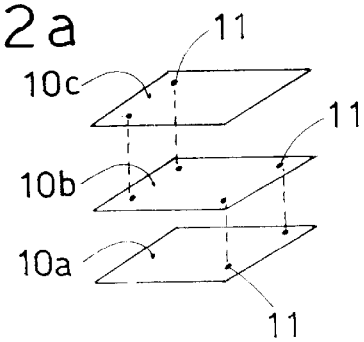
Figure 2D:
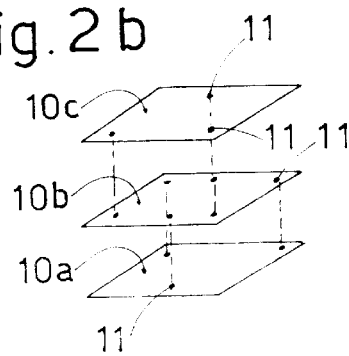

FIG. 2 show some possible positions of the spot welds 11 made on the green-tape foils 10 as follows:

FIG. 2*a* shows green-tape foils 10*a*, 10*b* and 10*c* in which two spot welds 11 are made alternately along one median axis of symmetry and along the other median axis of symmetry of the green-tape foil 10;

FIG. 2*b* shows green-tape foils 10*a*, 10*b* and 10*c* in which the spot welds 11 are made alternately along one diagonal and along the other diagonal of the green-tape foil 10;

FIG. 2*c* shows green-tape foils 10*a*, 10*b* and 10*c* in which the spot welds 11 are made alternately along one side and along the opposite side of the green-tape foil 10;

FIG. 2*d* shows green-tape foils 10*a*, 10*b* and 10*c* in which two spot welds 11 are three in number and are made alternately to form a substantially isosceles triangle with its vertex alternately on one side and on the opposite side.

The spot welds 11 can be made also at different positions on the relative green-tape foils 10.

In the examples shown only two or three spot welds 11 are provided between adjacent green-tape foils 10, but any desired number of spot welds can be provided.

In this example the spot welds 11 between two green-tape foils 10 could also be in the same position as the spot welds 11 between other green-tape foils 10.

Figure 3:
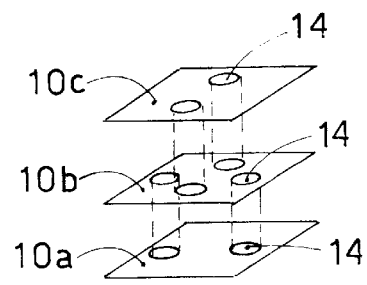
FIG. 3 is a diagram of a method to anchor three green-tape foils by slot welds according to the invention.

FIG. 3 shows green-tape foils 10*a*, 10*b* and 10*c* anchored together by slot welds 14 made along the diagonals of the green-tape foils 10. These slot welds 14 may have different shapes, for instance circular, oval, polygonal, etc.

Figure 4:
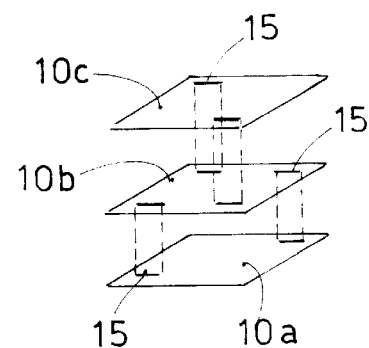
FIG. 4 is a diagram of a method to anchor green-tape foils by line welds according to the invention.

FIG. 4 shows green-tape foils 10*a*, 10*b* and 10*c* anchored together by line welds 15 made along the sides of the green-tape foil 10;

I claim:

1. Method of anchoring foils for green-tape circuits, whereby the foils have a surface and are printed and dried, and are superimposed on each other in a coordinated manner, the method comprising the steps of:

bonding at least a first green-tape foil to at least one other previously positioned green-tape foil by means of at least one weld made by a source of heat on the surface of one of said foils; and bonding at least a second green-tape foil to said bonded foils on the surface of said second foil displaced from said weld between said first foil and said previously positioned foil.

2. Method as in claim 1, whereby said first bonding step includes bonding a green-tape foil to the immediately preceding green-tape foil.

3. Method as in claim 1, whereby said first bonding step includes bonding said first green-tape foil to a plurality of green-tape foils at the same time.

4. Method as in claim 1, whereby said bonding step consists of at least two spot welds (11).

5. Method as in claim 1, whereby said bonding step consists of at least two slot welds (14).

6. Method as in claim 1, whereby said bonding step consists of at least two line welds (15).

* * * * *